United States Patent

Tanagawa

[11] Patent Number: 5,101,483
[45] Date of Patent: Mar. 31, 1992

[54] INSTRUCTION DECODER SIMPLIFICATION BY REUSE OF BITS TO PRODUCE THE SAME CONTROL STATES FOR DIFFERENT INSTRUCTIONS

[75] Inventor: Kouji Tanagawa, Tokyo, Japan

[73] Assignee: Oki Electric Industry Co., Ltd., Tokyo, Japan

[21] Appl. No.: 415,275

[22] PCT Filed: Jan. 25, 1989

[86] PCT No.: PCT/JP89/00065
§ 371 Date: Sep. 22, 1989
§ 102(e) Date: Sep. 22, 1989

[87] PCT Pub. No.: WO89/07297
PCT Pub. Date: Aug. 10, 1989

[30] Foreign Application Priority Data

Jan. 27, 1988 [JP] Japan .................. 63-14757
Mar. 18, 1988 [JP] Japan .................. 63-63186

[51] Int. Cl.⁵ .......................................... G06F 9/30
[52] U.S. Cl. ............................... 395/375; 364/931.5;
364/942.8; 364/946.2; 364/262.4; 364/DIG. 1;
364/DIG. 2
[58] Field of Search ... 364/200 MS File, 900 MS File

[56] References Cited

U.S. PATENT DOCUMENTS 3,949,370 4/1976 Reyling, Jr. et al. ............... 364/200
4,835,679 5/1989 Kida et al. ......................... 364/200

FOREIGN PATENT DOCUMENTS 59-20049 2/1984 Japan .

Primary Examiner—Thomas C. Lee
Assistant Examiner—Richard Lee Ellis
Attorney, Agent, or Firm—Spencer & Frank

[57] ABSTRACT

A microcomputer having a memory which stores coded instructions. An instruction register coupled to the memory is used for temporarily storing instructions one byte at a time. A programmable logic array is coupled to the register and has a decoder which decodes the bytes of the instruction in the register to provide control signals, the bytes of each instruction temporarily stored in the register producing control signals during each of at least first and second successive machine cycles. Where it is desired that control signals produced during the second machine cycle with a second instruction stored in the register includes all of the control signals produced during a second machine cycle with a first instruction stored in the register this is accomplished with a reduced number of decode lines in the array by providing that (1) a second byte of the first instruction has the same code as that of a first byte of the first instruction so that a single decode line can be used for decoding the first byte of the first instruction and the second byte of the second instruction, and (2) the array includes circuit elements which load the second byte of the second instruction from the memory into the register to be decoded by the decoder during the second machine cycle after a first byte of the second instruction has been loaded into the register and decoded by the decoder.

16 Claims, 8 Drawing Sheets

ADD A, #N

ADD A, M

Fig. 5a
ADD A, #N
13 — | 1 | 0 | 1 | 0 | 1 | 0 | 1 | 0 |
| | | | #N | | | |
Fig. 5b
ADD A, M
| 0 | 1 | 1 | 0 | 0 | 1 | 0 | 1 | — 11
| 1 | 0 | 1 | 0 | 1 | 0 | 1 | 0 | — 12
| | | | M | | | |
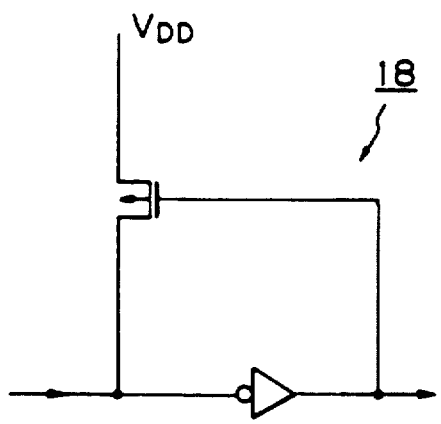
Fig. 7
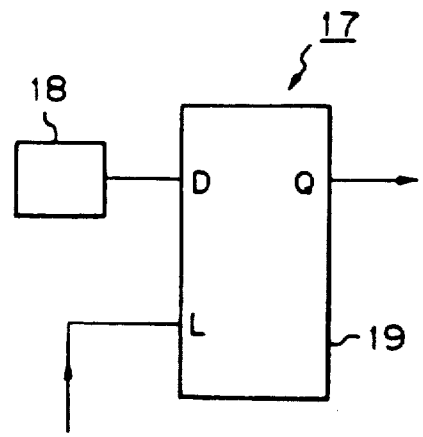
Fig. 8
M1, T2

ADD A,#N   (A,A)

ADD A, M   (6,5)

INSTRUCTION DECODER SIMPLIFICATION BY REUSE OF BITS TO PRODUCE THE SAME CONTROL STATES FOR DIFFERENT INSTRUCTIONS

TECHNICAL FIELD

The present invention relates to a microcomputer including a programmable logic array therein (hereinafter referred to as MC) and a method of testing the same.

BACKGROUND OF THE INVENTION

As illustrated in FIG. 1, a conventional MC includes a data bus, an instruction register IR, a programmable logic array PLA, a data register D, a stack pointer SP, accumlators A, B, temporary registers TRB, TRC, a programmable counter PC, a ROM, and a RAM.

The program counter specifies instructions stored in the ROM, the instructions being sequentially transmitted to the instruction register IR via the data bus.

The PLA includes control output lines connected to internal registers and memories, etc., decodes instruction data transmitted from the IR, and delivers control signals such as an EM (enable memory) signal, a WACC (write accumulator) signal, an EROM (enable read only memory) signal, and a WM (write memory) signal. Those control signals are to switch on and off the internal registers and the memories, and transfer the data stored in the RAM, accumulator, and ROM, etc., onto the data bus or write the data on the data bus in the RAM and accumulator, etc.

The ROM stores instruction codes constituting instructions shown in FIG. 2a and FIG. 2b, for example. An instruction "ADD A, #N", which is represented by an instruction code "1010, 1010" or "A, A", means that the contents stored in the accumulator A are added with #N that is, the contents of the second byte, and then, a result of the addition is stored in the accumulator. An instruction "ADD A, M", which is represented by an instruction code "0110, 0101" or "6, 5", means that the contents stored in the accumulator A are added with the contents stored in the RAM, and then a result of the addition is stored in the accumulator.

The PLA 200 includes, as illustrated in FIG. 32 for example, a plurality of NAND decoders 1, precharge circuits 2, 3, and a sense amplifier 18. The NAND decoder, 1 comprises enhancement FETs indicated by circles (0) as illustrated in FIG. 3b and depression FETs indicated by crosses (x) as illustrated in FIG. 3C. The precharge FET 2 has its one terminal connected to one terminal of the NAND decoder 1 and its other terminal connected to ground. The precharge FET 3 has its one terminal connected to the other terminal of the NAND decoder 1 and its other terminal connected to a power supply $V_{DD}$. Those precharge FETs 2, 3 further have their gates connected to precharge signal lines PRC, respectively.

In the following, operation of the PLA circuit shown in FIGS. 3A-3C will be described with reference to timing charts shown in FIGS. 6(a), (b). In a time interval T1 of a timing cycle in an interval M1 of a machine cycle, the control signal EROM opens the output gate of the ROM to fetch out the instruction code stored in the ROM onto the bus and the control signal WIR opens the input gate of the instruction register 100 to store the instruction code on the bus in the instruction register 100. When the instruction code fetched out from the instruction register IR 100 is "A, A", the NAND decoders 1 on decode lines L'1, L'3 become conductive in a machine cycle interval M2 to permit the sense amplifier 18 to input a signal "H" into the AND gate 6. Therefore, in a timing cycle interval T3 the control output signal EACC is generated on a control output signal line 4 via the AND gates 6, and in a timing cycle interval T4 the control output signal WACC is generated. Additionally, when the instruction code is "6, 5", the NAND decoders 1 located on decode lines L'2, L'4 become conductive in a machine cycle interval M2 to permit the sense amplifier 18 to input a signal "H" into the AND gate 6. Therefore, in the timing cycle interval T3 the control output signal ACC is generated on the control output signal line 4, and in a timing cycle interval T4 the control output signal WACC is generated. Here, the control signals such as EROM, WIR, PCUP, and the like illustrated in FIG. 1 are issued from a timing control circuit T/C.

Such a conventional PLA circuit, however, has a problem that all instruction codes for an instruction must be decoded to generate the control signals necessary for the execution of the instruction. One instruction code generally requires four decode lines on the average, for example the instruction "A, A" requires the decode lines L'1, L'3, ..., the instruction "6, 5" requires the decode lines L'2, L'4, L'5, ... That is, 100 instructions require about 400 decode lines in all. If the width of a single decode line of the PLA circuit which is formed on a semiconductor chip is assumed to be 10 μm upon integrating the PLA, the PLA has its entire width ranging from 4 to 7 mm and hence occupies a wide areas of the semiconductor chip, therefore requiring that the chip be large.

Such a PLA incorporated in the MC must be tested to determine whether or not it operates in a proper manner. Such a test is carried out two or three times during the last stage of the manufacture of semiconductors or during a process of packaging the semiconductors. A typical MC includes about 100 to 200 output lines 4 for the control signals issued from the PLA. However, those control signal output lines 4 are connected to input/output gates of various of registers included in the MC but are not connected to external output terminals. This does not allow a direct check on of the control signals issued from the PLA. Accordingly, to test the existence of any short-circuit in the wiring in the PLA and that of any abnormal FET in the same, a MC program stored in the ROM is first executed in succession for every instruction. Then, contents in each register which is the object of an instruction, and contents in all registers other than that which is the object of each instruction are read out each time for their checks. It is thereby checked that decoding and execution control of the instructions are carried out correctly, and tested indirectly that the PLA is normal. When for example an instruction "MOV A, B" is given from the outside to the MC and executed, a check of the contents stored in an accumulator (ACC) and a temporary register B (TRB) is performed to confirm that the contents stored in the TRB have been moved into the ACC, and to check that there is no change in the contents stored in other registers and the like after fetching out those contents to the outside followed by execution of the instruction "MOV A, B". However, the aforementioned operation to test the PLA requires a data check concerning internal circuits amounting to 1000 to 100,000 steps using the tester, which substantially makes it impossible to achieve the complete test. In addition, since the tester must usually be employed for varieties of test excepting the aforementioned object, use of such an expensive tester over a long period of time makes uneconomical the associated device. Furthermore, a program for such a test is very complicated, requiring much labor for preparation thereof.

In view of the drawback of the prior art, it is an object of the present invention to reduce the absolute number of decode lines while retaining their same functions as in the prior art. It is another object of the invention a test of short duration of whether or not all of the wiring in the programmable logic array circuit is operationally normally.

SUMMARY OF THE INVENTION

A microcomputer includes in general varieties of instructions amounting in total of about one hundred, some of which have a very similar format. For example, the foregoing instructions "ADD A, #N" and "ADD A, M" are the same instruction of addition, and are different only in that the former allows data to be fetched from "#N" or the second byte thereof or the buffer from a memory designated at "M". Such similar instructions have almost common formats of control line signals and timing of the same.

A microcomputer in accordance with the first embodiment of the invention comprises, in view of a feature of those similar instructions being common in operation timing, a memory for storing a first instruction including a first byte and a second instruction including a first byte and a second byte having the same code as that of the first byte of the first instruction, an instruction register and means for loading the second byte of the second instruction to the instruction register after decoding the first byte of the second instruction.

In accordance with the second embodiment of the invention, there is provided a test circuit for testing a microcomputer which has a programmable logic array, said programmable logic array comprising :

(a) a NAND type decoder having (i) inputs for receiving an instruction code and a timing signal, (ii) a control signal output line, and (iii) a plurality of MOSFETs serially connected ;

(b) a first precharge MOSFET connected between one end of the output line of the decoder and the ground; and (c) a second precharge MOSFET connected between the other end of the output line of the decoder and a power supply; the improvement wherein the test circuit further has means for making the first precharging MOSFET conductive during testing the programmable logic array.

BRIEF DESCRIPTION OF THE DRAWINGS

FIG. 3b is a detail showing the enhancement FET which comprises the crosspoints marked with an "O" in the NAND decoder of FIG. 3a; FIG. 3c is a detail showing the depletion FET which comprises the crosspoint marked with an "X" in the NAND decoder of FIG. 3a;

FIGS. 5a and 5b illustrate illustrating formats of instruction codes in the embodiment of FIG. 4;

FIG. 7 is a logic circuit diagram illustrating a sense amplifier for use in the present invention;

FIG. 8 is a logic circuit diagram illustrating a delay circuit for use in the present invention;

BEST MODE FOR CARRYING OUT THE INVENTION

In the following, a first embodiment of the invention will be described with reference to FIGS. 4 through 8.

Figure 1:
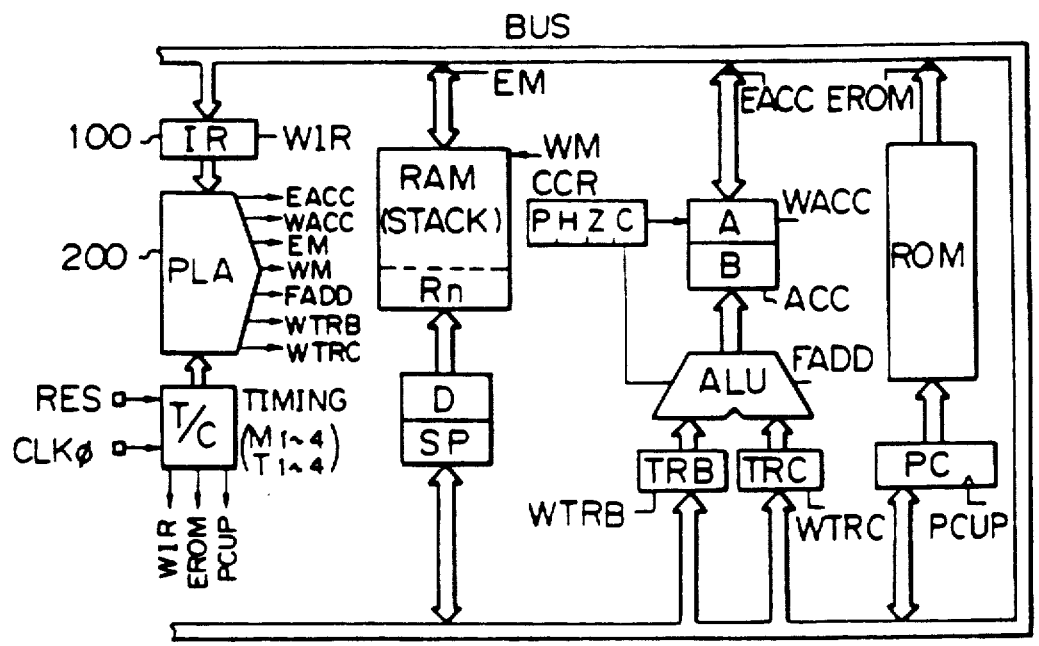
FIG. 1 is a circuit block diagram illustrating a typical microcomputer (MC)
Figure 2A:
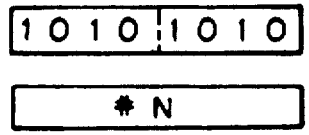
FIGS. 2a and 2b are views illustrating formats of conventional instruction code.
Figure 2B:
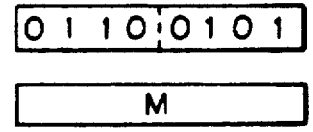

FIGS. 5a and 5b illustrate addition instructions "ADD A, #N" and "ADD A, M", the latter being analogous to the former addition instruction "ADD, A, M" previously described in relation to the prior art. The former addition instruction "ADD A, #N" is not different from the conventional instruction code illustrated in FIGS 2a and 2b. Against this, a first byte code 11 of a certain addition instruction "ADD A, M" is not different from the conventional one, but a second byte code 12 of the same/possesses the same code as the first byte code 13 of the analogous addition instruction "ADD A, #N".

Figure 3A:
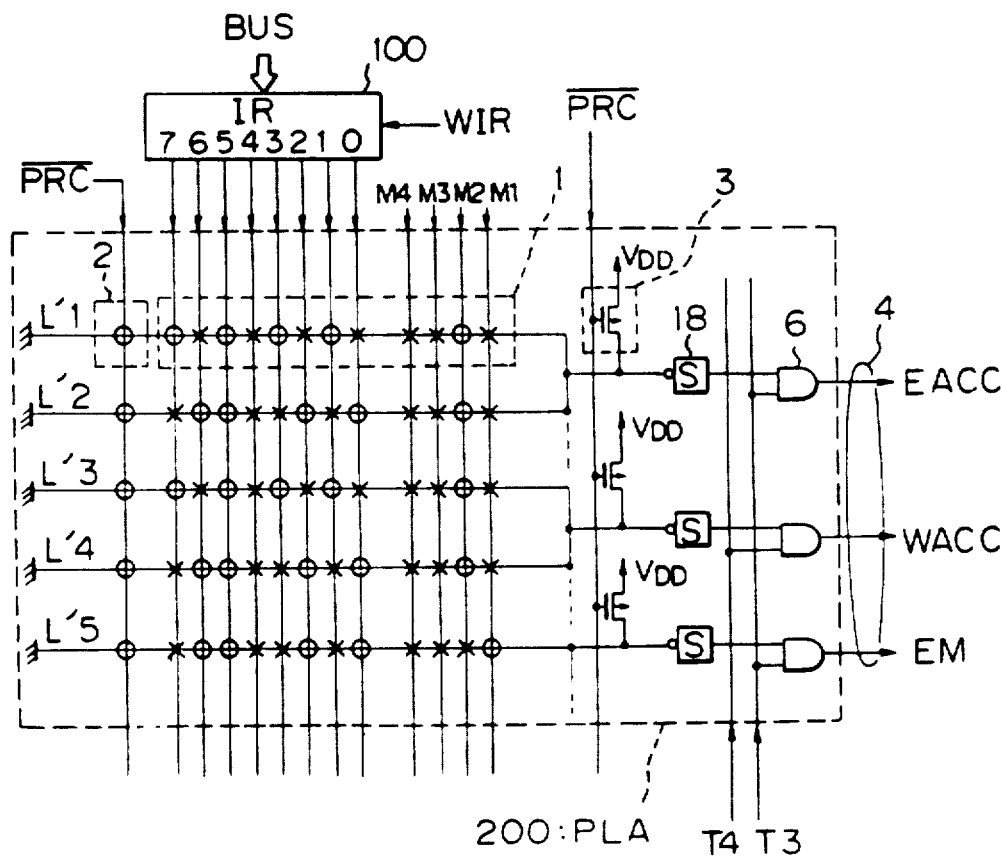
FIGS. 3a is a circuit block diagram illustrating a conventional programmable logic array.
Figure 3B:
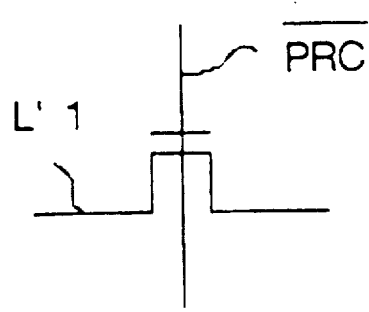
Figure 3C:
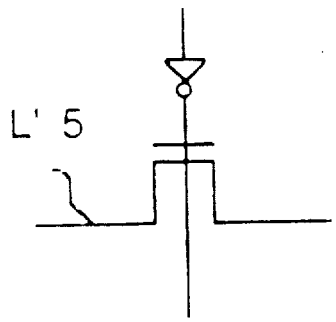
Figure 4:
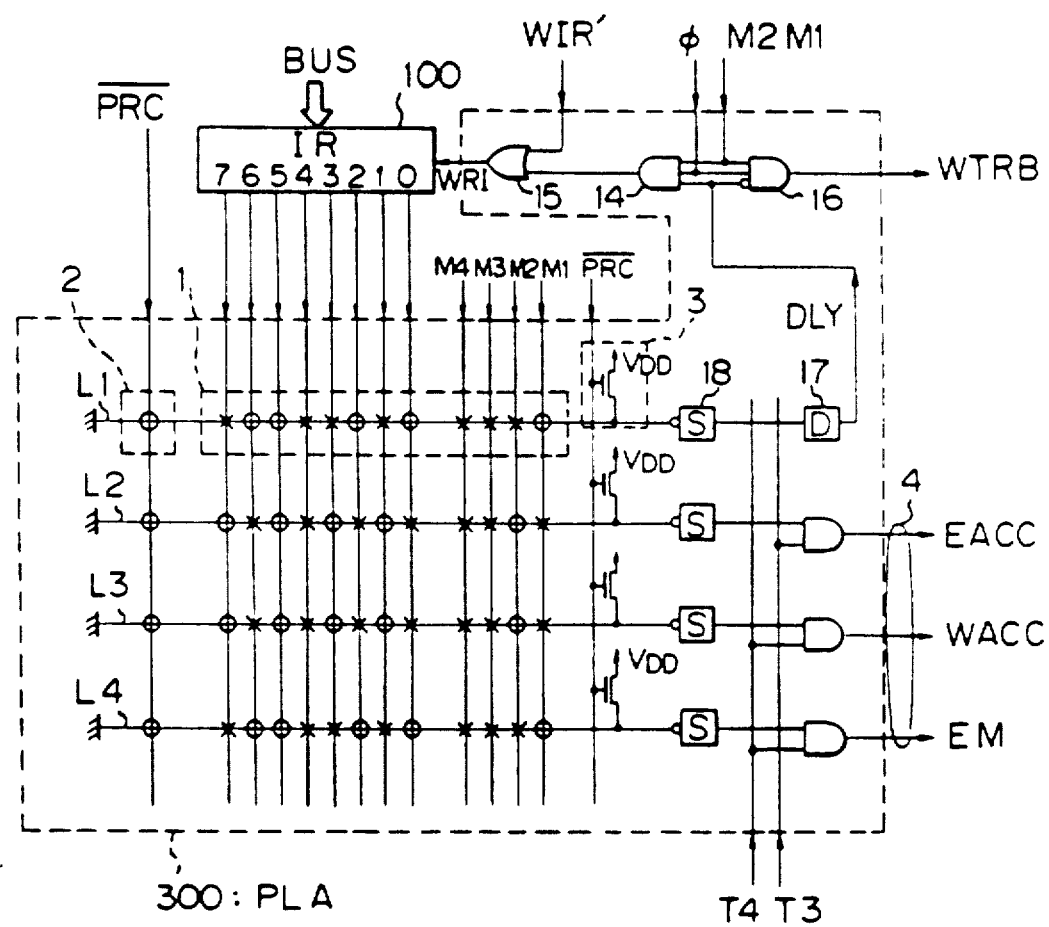
FIG. 4 is a circuit block diagram illustrating a programmable logic array (PLA) of an embodiment according to the present invention.

As illustrated in FIG. 4, which exhibits a circuit for a PLA of the embodiment according to the first invention, a decode line L1 is a NAND decoder for a code "6, 5", that is, the addition instruction "Add A, M", which is operated in a machine cycle interval M1. Namely, when the first byte instruction code "6, 5" of the instruction "ADD A, M" is entered into an instruction register 100, the decode line L1 is activated (i.e., to a "L" level) to permit a "H" level signal (load signal) to be entered into a delay circuit 17 via a sense amplifier 18. Here, the sense amplifier 18 and the delay circuit 17 are arranged as illustrated in FIGS. 7 and 8. The delay circuit 17 issues a control signal WIR to open the instruction register IR in the next timing cycle interval M2, T1 under the control of gates 14, 15, 16, gate for thereby loading the instruction register IR with a second byte code "A, A" from a bus. Simultaneously, a control line signal WTRB is prohibited from being generated. When the decode line L1 decodes the first byte of the instruction as described above, the delay circuit 17, and the gates 14, 15, 16 load the instruction register IR with the second byte of that instruction. A decode line L4 corresponds to the decode line L5 shown in the circuit diagram of the conventional PLA of FIG. 3a. It therefore issues a control signal EM in a timing cycle interval M1, T4. Decode lines L2, L3, which correspond to L'1, L'3 involved in the conventional PLA circuit of FIG. 3a, respectively issue a control signal EACC in a timing cycle interval M2, T3 and a control signal WACC in a timing cycle interval M2, T4.

Figure 6A:
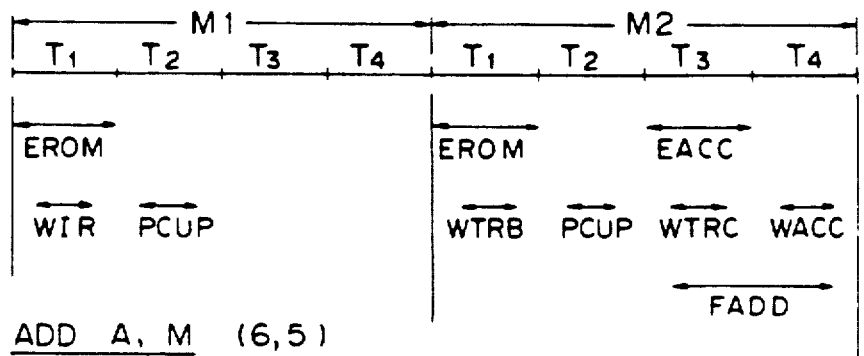
FIGS. 6a and are timing charts illustrating the operation of the embodiment of FIG. 4.
Figure 6B:
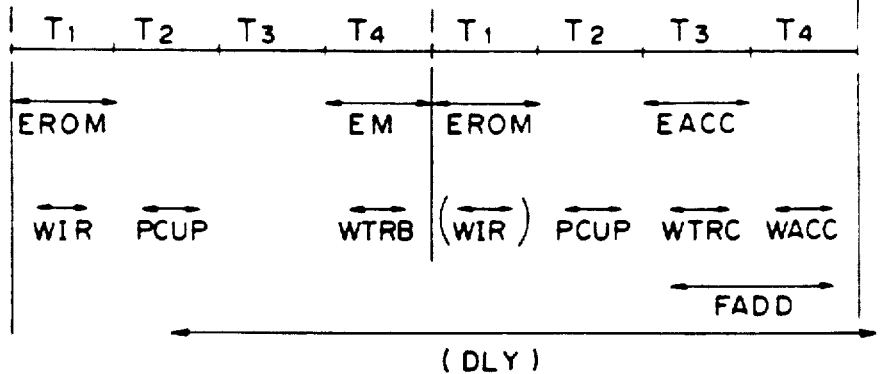

Thus the PLA of the embodiment according to the first invention illustrated in FIG. 4 can exhibit the operation timing of control signals illustrated in FIG. 6, does the conventional PLA shown in FIG. 3a. It should here be understood from a comparison of the decode lines in the PLA of FIGS. 3a and 4 that the conventional decode lines L'2 and L'4 are not required and L1 is nonexistent in the conventional case.

Decode lines for control signals WTRC and FADD can also be reduced, although not illustrated in the PLA circuit diagram of FIG. 4.

The MC includes substantially about 16 groups of analogous instructions such as ADD, ADC, SUB, SBB, OR, AND, EOR, INC, DEC, CMP, CPL, RRC, RLC, SRC, SLC, and the like. In a typical MC operational with about 8 bits, 5 decode lines on the average can be reduced among analogous instructions and about 80 decode lines as a whole can be reduced.

Although in the above description the first and second byte instruction codes were shown as being common as an illustrative example, a combination of the second and third bytes may also be possible or with a replacement thereof for the machine cycles a combination of second and third machine cycles may be possible, as a matter of course.

In succession, an embodiment of a test circuit for a microcomputer according to the second embodiment will be described with reference to FIGS. 9, 10, and 11. Here, the like symbols shall be applied to the like constituent elements as those of the conventional one and the first invention, and the description thereof will here be omitted. Namely, a PLA circuit which includes in itself a NAND decoder 1, precharge FETs 2, 3, and a sense amplifier, etc., is constructed as in the first embodiment. In the circuit diagram of a PLA test circuit of an embodiment according to the second invention illustrated in FIG. 9, an OR gate 21 has its input connected to a test terminal 22 and a $\overline{PRC}$ (precharge) signal line and has its output connected to a gate of a precharge FET 2. The precharge FET, which is of an enhancement type as described previously, grounds the NAND decoder 1 at all times when the test terminal 22 is "H" at its input together with the conventional $\overline{PRC}$ input being "H", or when a test is executed. On the contrary, an external power supply 25 is connected via an external ammeter 24 to a VDD terminal 23 disposed on a semiconductor chip. The VDD terminal 23 is connected to one end of a precharge FET 3 whose other end is connected to the output of the NAND decoder 1. In the present embodiment, the ammeter 24 is a current measuring unit in a general-purpose tester, and the DC power supply 25 is a +5V one included in the same tester.

Figure 11:
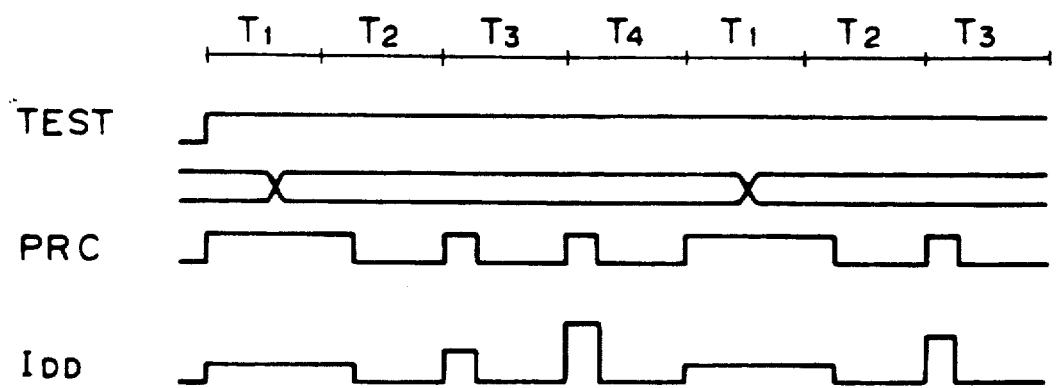
FIG. 11 is a timing chart illustrating a test on the PLA of the embodiment according to the present invention.

FIG. 11 is a timing chart illustrating a test operation for the PLA in the MC in the embodiment according to the second invention. In what follows, operation of the just mentioned test operation will be described with reference to FIG. 11 and to the circuit diagram of FIG. 9.

In a test interval for the PLA, the test terminal 22 is kept at a "H" level. Hereby, the precharge FET 2 becomes conductive to permit the NAND decoder 1 to be grounded at its one end at all times. In succession, in the timing T1, an instruction is entered. For example, when an instruction "MOV A, B" is entered, the NAND decoder 1 for an instruction code corresponding to that instruction becomes conductive. In the timing T1, the precharge signal (PRC) is at a "H" level, and the $\overline{PRC}$ becomes a "L" level. Hereby, the precharge FET 3 becomes conductive because of its being of a P channel type, and in the timing T1 a current IDD from the power supply 25 flows through a current route: precharge FET 3, NAND decoder 1, and precharge FET 2 because all those elements become conductive thereupon, allowing a current corresponding to the single NAND decoder or that corresponding to the single control signal to be read by the ammeter 24.

Such a conduction current through the single NAND decoder is approximately 50μA when the MC is constructed with a CMOS semiconductor. In opposition, if a current to that degree is detected, then it can be estimated that one control signal has been activated. In addition, although in the above situation a current flowed in the timing T1 corresponding to one control signal, the reason is that since the timing lies during the time when an instruction is entered, only that instruction is selected. Then, when the PRC becomes a "L" level in the timing T2, the $\overline{PRC}$ becomes a "H" level and the precharge FET 3 is switched off. Hereby, no power supply current IDD flows.

It is here assumed that two control outputs are activated to a "H" level in a timing T3 for execution of the instruction "MOV A, B". Hereupon, two NAND decoders 1 have been conductive unless there is any short-circuit through wirings and any disconnection therealong. In this situation, the PRC changes to a "H" level in the timing T3, a conduction current flows through the precharge FET 3 because the NAND decoder 1 and the precharge FET 3 have already been conductive. Since thereupon the two NAND decoders have been conductive, there flows approximately 100 μA of the power supply current IDD corresponding to the two control singals.

In succession, it is assumed on the design that the four control signal outputs have been at an active "A" level in the timing T4. Since in this situation, the four NAND decoders are conductive as in the timing T3, there flows the power supply current corresponding to the four control signal outputs. It is thus possible to measure the number of the control signal outputs by measuring the power supply current in each timing. Accordingly, a complete test can be achieved for all NAND decoders. If there is any trouble such as disconnection or short-circuit of wirings or bad transitors, or the like in the PLA in the manufacture of semiconductors of the MC, then the measured number of NAND decoders made conductive is not equal to that of NAND decoders made conductive on the design in each timing, allowing a bad PLA to be immediately detected by a tester program.

The PLA of a MC includes in general NAND decoders amounting to about 100 through 500, requiring the steps of its test of about 400 through 2000 even when the test is assumed to be done in respective timings of T1 and T2. This corresponds to a very short time.

Figure 9:
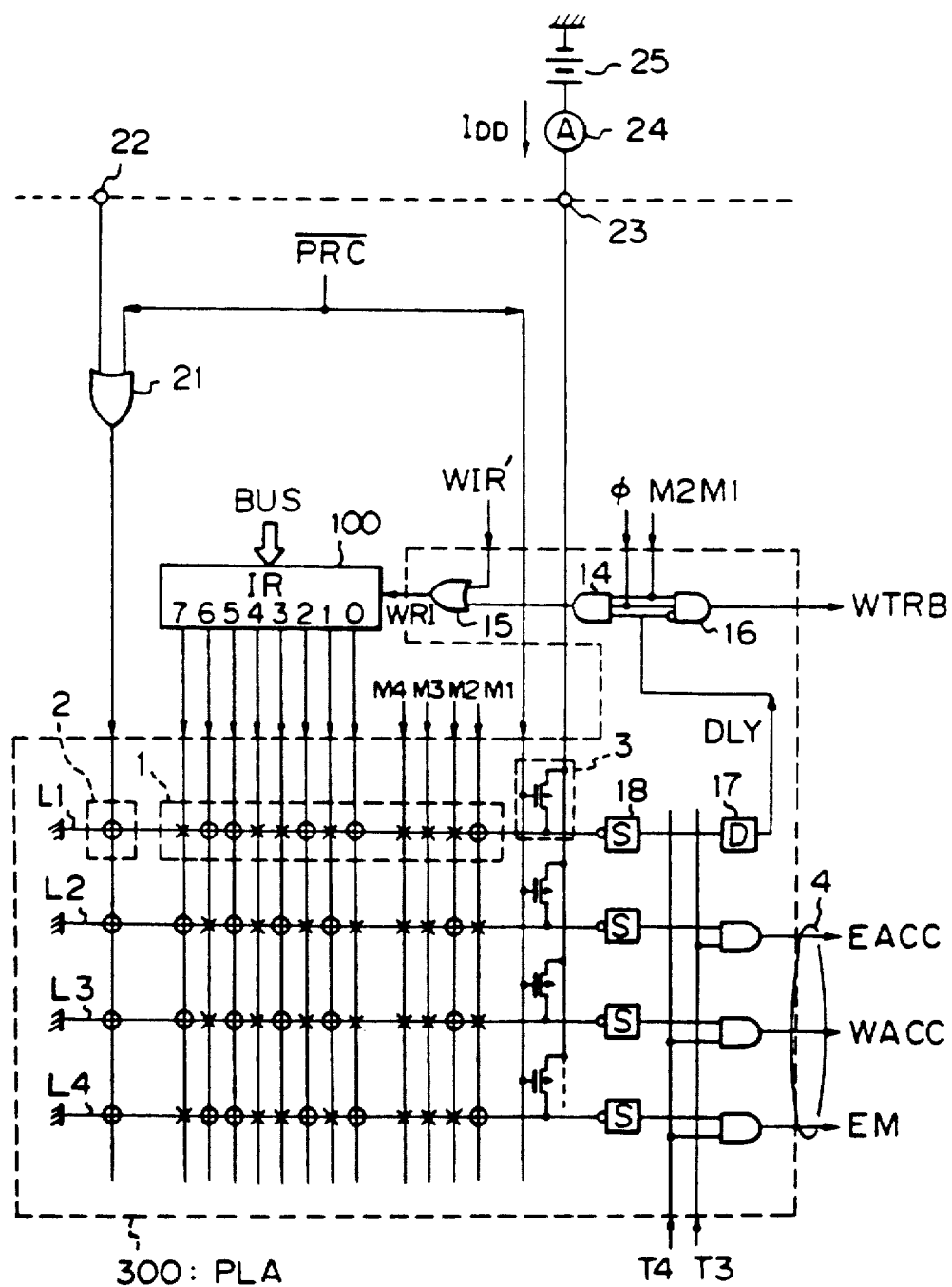
FIG. 9 is a circuit diagram illustrating a PLA test circuit of the embodiment according to the present invention.
Figure 10:
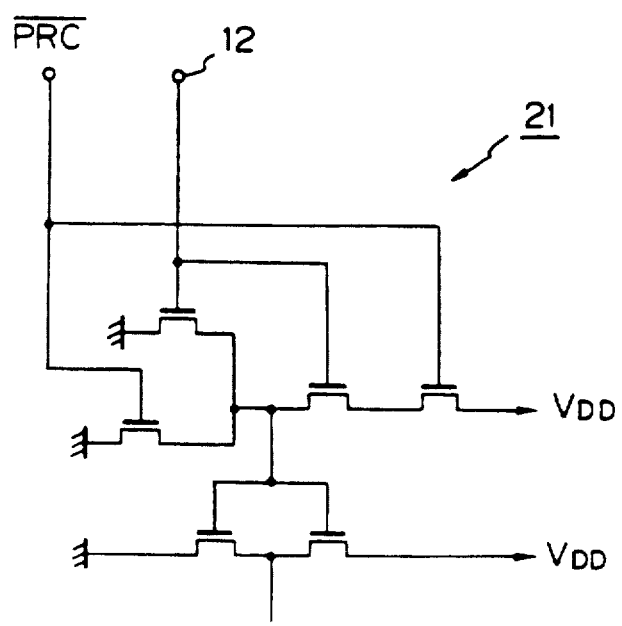
FIG. 10 is a logic circuit diagram illustrating an OR gate for use in the present invention.
Figure 12:
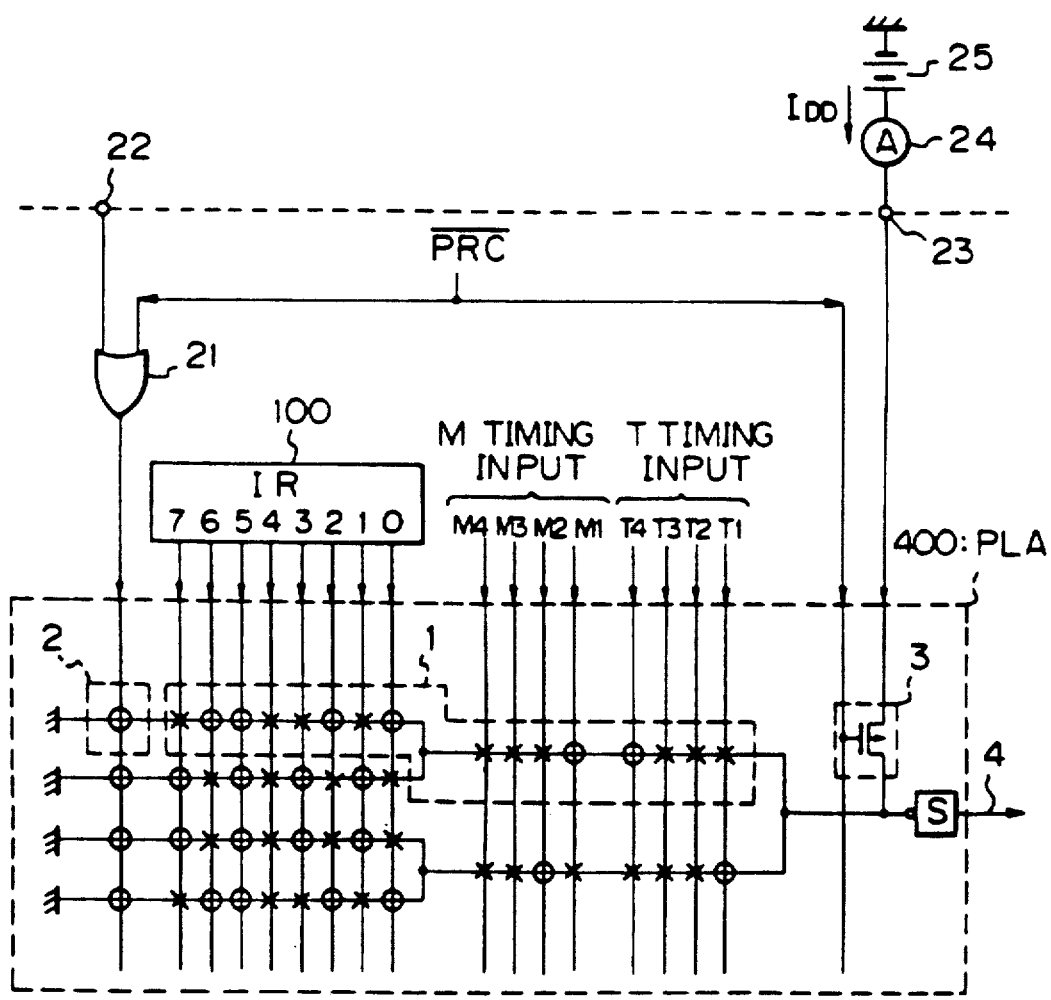
FIG. 12 is a circuit diagram illustrating a PLA test circuit of another embodiment according to the present invention.

A PLA circuit of another embodiment according to the second invention illustrated in FIG. 12 is the same in its principle of operation as that of the first embodiment illustrated in FIG. 9. Namely, a precharge FET 2 is made conductive to establish a DC path through a NAND decoder 1. In this situation, if there is any signal to be decoded corresponding to an input from an instruction register 100, a T timing input, and a M timing input, then a DC current flows from a power supply VDD via a precharge FET 3. The current is compared with the number of decoded signals for determination of the quality of the measurement.

Although in the present specification the PLA of the MC was described, the present invention is applicable also for a PLA of a microprocessor.

INDUSTRIAL APPLICABILITY

According to the MC of the first invention, as described above, the number of decode lines can be reduced by employing analogous instruction codes as being common. That is, since the second byte of a certain instruction set among analogous instruction sets can intactly utilize a control signal output of the first byte of the certain instruction set being an analogous instruction of that instruction. Accordingly, if there is a decode line only for the first byte of the certain instruction set, then the intact use of that decode line in the analogus instruction enables the analogous instruction to be executed. Thus, the first invention, which employs a certain decode line for other decode lines, can reduce the occupation area of those decode lines on the chip compared with the prior MCs, which include for a different instruction code a corresponding decode line. To be concrete, 400 through 600 decode lines can be reduced by about 80 ones, and the area occupied by the PLA on the whole semiconductor chip area can be reduced by 10 to 20%. The first invention can thus reduce the chip area greatly, keeping the same function of the device as in the conventional PLA circuit, and assuring very high industrial applicability.

Additionally, according to the PLA test circuit of the second invention, the number of the conducted NAND decoders is measured on the basis of the power supply current IDD in the part of the PLA of the MC. Accordingly, the power supply current IDD may be measured only for all timings of the instruction sets possessed by the MC. This simplifies a data check in the conventional case amounting 10000 through 100000 steps to about 2000 steps. Furthermore, according to the second invention, a direct test of the circuit part of the PLA can be achieved without requiring a check on data stored in registers, etc., which can be checked externally of the MC. Thus, greater shortening of the time required for a test and sharp reduction of the step number for preparation of a test program can be realized, assuring very high industrial applicability.

I claim:
1. An apparatus comprising
    a memory storing coded instructions, the instructions including (1) a first instruction having a first byte and (2) a second instruction having a second byte and a third byte, the third byte having the same code as that of the first byte;
    an instruction register for temporarily storing the instructions one byte at a time;
    means for loading the instructions from said memory into said register; and
    means for decoding the instructions temporarily stored in said register to produce control signals during each of at least first and second successive machine cycles, the control signals produced during the second machine cycle with the second instruction stored in said register including the same control signals produced during the second machine cycle with the first instruction stored in said register;
    said loading means including means for loading the third byte from said memory into said register to be decoded by said decoding means during the second machine cycle after the second byte has been loaded into said register and decoded by said decoding means.

2. An apparatus according to claim 1, wherein said decoding means is responsive to the second byte in said register during the first machine cycle for producing a load signal, said loading means being responsive to the load signal for loading the third byte from said memory into said register to be decoded by said decoding means during the second machine cycle.

3. An apparatus according to claim 1, wherein said decoding means is a programmable logic array having a first decode line, said first line being activated by the first byte during each of the first and second machine cycles when the first instruction is stored in said register, said first line being activated by the third byte during the second cycle when the second instruction is stored in said register.

4. An apparatus according to claim 3, wherein said array has a second decode line which is activated by the second byte during the first machine cycle when the second byte is stored in said register to produce a load signal, said loading means being responsive to the load signal for loading the third byte into said register.

5. An apparatus according to claim 1, wherein said decoding means is formed of a programmable logic array.

6. An apparatus according to claim 1, wherein said decoding means and said loading means together comprise a programmable logic array.

7. An apparatus, comprising
    a memory storing (1) a first instruction including a first byte and (2) a second instruction including a second byte and a third byte of the same code as that of the first byte;
    an instruction register coupled to said memory;
    means for decoding the second byte when said second byte is stored in said register; and
    means for loading the second byte from said memory into said register and for loading the third byte from said memory into said register after the second byte is loaded from said memory into said register by said loading means and decoded by said decoding means.

8. An apparatus according to claim 7, wherein said decoding means is formed of a programmable logic array.

9. An apparatus according to claim 7, wherein said decoding means and said loading means together comprise a programmable logic array.

10. An apparatus according to claim 9, wherein said first instruction has a plurality of bytes including the first byte, said decoding means being connected to said register, the apparatus further comprising a bus connected to said memory and to said register, said loading means including means for
    (1) loading the second byte via said bus into said register to be decoded by said decoding means, and
    (2) loading the third byte via said bus into said register after the second byte is decoded by said decoding means.

11. An apparatus according to claim 10, further comprising a bus coupled to said memory and to said register, wherein said decoding means is responsive to the second byte in said register to produce a load signal, said loading means being responsive to the load signal to load the third byte from said memory via said bus into said register.

12. An apparatus according to claim 11, wherein said decoding means and said loading means together comprise a 13. An apparatus according to claim 12, further comprising a delay circuit interposed between said decoding means and said loading means for delaying the load signal reaching said loading means.

14. An apparatus, comprising an instruction register for temporarily storing an instruction code, a memory storing coded instructions, the instructions including (1) a first instruction having a first byte and (2) a second instruction having a second byte and a third byte, the second byte having a first instruction code, the first and third bytes each having a second instruction code;

a bus coupled to said register and to said memory;

a decoder, coupled to said register, for decoding instruction codes stored in said register, said decoder including means for generating a load signal in response to the second byte being stored in said register; and means, coupled to said decoder and responsive to the load signal, for loading the third byte from said memory into said register via said bus.

15. An apparatus according to claim 14, wherein said decoding means is formed of a programmable logic array.

16. An apparatus according to claim 14, wherein said decoder is a programmable logic array having first and second decode lines, said first line being activated by the second byte to produce the load signal when the second byte is stored in said register, said second line being activated by the first byte when the first byte is stored in said register, said first line being activated by the third byte when the third byte is stored in said register.

* * * * *